(12) United States Patent
Jung

(10) Patent No.: US 6,826,089 B2
(45) Date of Patent: Nov. 30, 2004

(54) DATA OUTPUT DRIVER AND DATA OUTPUT METHOD FOR MINIMIZING DATA OUTPUT TIME VARIATIONS CAUSED BY DATA PATERNS

(75) Inventor: In-young Jung, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 24 days.

(21) Appl. No.: 10/323,971

(22) Filed: Dec. 20, 2002

(65) Prior Publication Data

US 2003/0227797 A1 Dec. 11, 2003

(30) Foreign Application Priority Data

Jun. 11, 2002 (KR) ........................................ 2002-32603

(51) Int. Cl.[7] ............................................. G11C 16/04
(52) U.S. Cl. .............................. 365/189.05; 365/189.08; 365/189.11
(58) Field of Search ....................... 365/189.05, 189.11, 365/189.08, 189.06, 189.09; 327/393, 394

(56) References Cited

U.S. PATENT DOCUMENTS

| | | | | |
|---|---|---|---|---|
| 5,418,746 A | * | 5/1995 | Choi | 365/189.05 |
| 5,802,009 A | * | 9/1998 | Casper et al. | 365/230.06 |
| 5,850,159 A | * | 12/1998 | Chow et al. | 327/394 |
| 5,940,320 A | * | 8/1999 | Casper et al. | 365/185.11 |
| 5,963,493 A | * | 10/1999 | Merritt et al. | 365/203 |
| 6,285,215 B1 | * | 9/2001 | Voshell | 326/86 |
| 6,330,196 B1 | * | 12/2001 | Protzman | 365/189.11 |
| 6,646,949 B1 | * | 11/2003 | Ellis et al. | 365/230.06 |

* cited by examiner

*Primary Examiner*—Richard Elms
*Assistant Examiner*—Hien Nguyen
(74) *Attorney, Agent, or Firm*—Volentine Francos & Whitt, PLLC

(57) ABSTRACT

A data output driver includes an intermediate node; a first driver, connected between the intermediate node and an output terminal, providing a current path between the intermediate node and the output terminal in response to an enable signal input to a control terminal thereof; a second driver connected between the intermediate node and a lower supply voltage and driving the data to the output terminal through the intermediate node in a data read operation; and a voltage control circuit connected between the intermediate node and the lower supply voltage, wherein the voltage control circuit causes at least a portion of the current of the intermediate node to flow to the lower supply voltage in response to a control signal input to a control terminal thereof. The data output driver, and associated data output method, minimize the variation of a data output time caused by various input data patterns.

18 Claims, 8 Drawing Sheets

DATA OUTPUT DRIVER AND DATA OUTPUT METHOD FOR MINIMIZING DATA OUTPUT TIME VARIATIONS CAUSED BY DATA PATERNS

CROSS-REFERENCES TO RELATED APPLICATIONS

This application claims priority from Korean Patent Application No. 2002-32603, filed on Jun. 11, 2002, the contents of which are hereby incorporated by reference herein in their entirety for all purposes as if fully set forth herein.

BACKGROUND AND SUMMARY

1. Technical Field

The present invention relates to a semiconductor memory device, and more particularly, to a data output driver and data output method for minimizing data output time (tQ) variation caused by various data patterns.

2. Description

High integration, low power consumption, and high speed are the trends of semiconductor memory devices today. That is, semiconductor memory devices that process more data at a higher speed with less power consumption are needed.

As a result, for high speed operation of a semiconductor memory device, a synchronous dynamic random access memory (SDRAM) synchronized with a system clock has been developed.

Also, more recently, according to demands for a higher operation speed, a dual data rate (DDR) synchronous DRAM and a RAMBUS® DRAM have been developed that input or output data synchronized both at the rising edge and the falling edge of a system clock.

FIG. 1 is a timing diagram showing variations in data output time (tQ).

Referring to FIG. 1, it is preferable that both in the synchronous DRAM and RAMBUS® DRAM, the output time (tQ) of each data item through a plurality of input and/or output pads synchronized to a system clock (CLOCK) is almost constant.

Here, tQ=0 denotes a case when the center of data (D) coincides with the rising edge of the system clock (CLOCK), and tQ=Δt denotes a case when the center of data is output after being delayed for a predetermined time from the rising edge of the system clock (CLOCK).

Therefore, when the output time (tQ) of each data item through the plurality of input and/or output pads is different from each other, the performance of the semiconductor device is degraded.

Also, in testing RAMBUS® DRAMs, semiconductor device manufacturers test the data output time (tQ) through input and/or output pads according to predetermined specifications, and RAMBUS® DRAMs that do not satisfy the specifications are treated as poor quality products. As a result, the yield of semiconductor chips may decrease.

To address these problems, it is an object of the present invention to provide a data output driver and data output method that minimizes data output time (tQ) variations caused by data patterns that are input.

According to one aspect of the invention, a data output driver adapted to drive data that is input through an input terminal, to an output terminal, comprises: an intermediate node; a first driver connected between the output terminal and the intermediate node, the first driver having a control terminal and being adapted to provide a current path between the intermediate node and the output terminal in response to an enable signal input to the control terminal; a second driver connected between the intermediate node and a lower supply voltage (e.g., ground) and being adapted to drive the data that is input to the input terminal to the output terminal through the intermediate node in a data read operation; and a voltage control circuit connected between the intermediate node and the lower supply voltage, wherein the voltage control circuit has a control terminal and is adapted to cause at least a portion of the current of the intermediate node to flow to the lower supply voltage in response to a control signal input to the control terminal.

When the data output driver performs a data read operation, beneficially the voltage control circuit is adapted to maintain a voltage swing at the intermediate node at a substantially constant level during the data read operation.

According to another aspect of the invention, a data output driver having an input terminal and an output terminal, comprises: a first current path provided between the output terminal and an intermediate node when a data read operation is performed; a driver adapted to drive data that is input through the input terminal, to the output terminal through the intermediate node in the data read operation; and a second current path provided between the intermediate node and a lower supply voltage (e.g., ground) during the data read operation.

Beneficially, the second current path causes a portion of a charging current, that flows into the intermediate node through the first current path, to flow into the lower supply voltage.

According to yet another aspect of the invention, a data output driver adapted to drive data that is input through an input terminal, to an output terminal, comprises: an intermediate node; a first transistor connected between the output terminal and the intermediate node, the first transistor including a control terminal to which an enable signal is input; a second transistor connected between the intermediate node and a lower supply voltage (e.g., ground), the second transistor including the input terminal through which the data is input; and a third transistor connected between the intermediate node and the lower supply voltage, the third transistor including a control terminal to which a control signal is input.

Beneficially, the enable signal is activated when the data output driver performs a data read operation. Beneficially, the control signal is activated when the data output driver performs a data read operation. When the data output driver performs a data read operation, it is preferable that the third transistor discharges to the lower supply voltage a portion of a current flowing into the intermediate node, to maintain a voltage swing at the intermediate node at a substantially constant level. Beneficially, the first through the third transistors are NMOS transistors.

According to still another aspect of the invention, a data output driver comprises: an output terminal; an intermediate node; a first transistor connected between the output terminal and the intermediate node, and including a gate to which an enable signal is input; a second transistor connected between the intermediate node and a lower supply voltage (e.g., ground), and including a gate to which data is input; and a third transistor connected between the intermediate node and the lower supply voltage, and comprising a gate to which a control signal is input.

Beneficially, when the data output driver performs a data read operation, the third transistor causes a predetermined amount of a current flowing into the intermediate node through the first transistor to flow to the lower supply voltage, maintaining a voltage swing at the intermediate node at a substantially constant level during the data read operation.

According to a further aspect of the invention, in a data output driver having an input terminal, an output terminal, and an intermediate node, a method of outputting to the output terminal data that is input to the input terminal comprises: providing a current path between the intermediate node and a lower supply voltage (e.g., ground) to maintain a voltage swing voltage at the intermediate node at a substantially constant level during a data read operation; and outputting through the intermediate node to the output terminal the data that is input to the input terminal.

In connecting the intermediate node to a ground, it is beneficial that in response to a data read signal a predetermined amount of a charging current flowing into the intermediate node is caused to flow into the lower supply voltage, so that the voltage swing of the intermediate node is kept constant.

In yet a further aspect of the invention, in a data output driver having an input terminal, an output terminal, and an intermediate node, a method of outputting to the output terminal data that is input to the input terminal comprises: maintaining a voltage swing at the intermediate node at a substantially constant level during a data read operation; and outputting the data which is input through the input terminal, to the output terminal through the intermediate node.

In still a further aspect of the invention, there is provided a semiconductor memory device comprising a plurality of data output drivers for outputting data that are input through respective input terminals, to respective output terminals, wherein each of the plurality of data output drivers comprises: an intermediate node; a first transistor connected between one of the output terminals and the intermediate node, and including a gate to which an enable signal is input; a second transistor connected between the intermediate node and a lower supply voltage, and including a gate to which one of the plural data is input; and a third transistor connected between the intermediate node and the lower supply voltage, and comprising a gate to which a control signal is input.

Beneficially, when the semiconductor memory device performs a data read operation, the third transistor causes a predetermined amount of a current flowing into the intermediate node through the first transistor to flow to the lower supply voltage, maintaining a voltage swing at the intermediate node at a substantially constant level during the data read operation.

In yet a still further aspect of the invention, a data output driver having an input terminal and an output terminal, comprises: an intermediate node; a first transistor connected between the output terminal and the intermediate node, the first transistor including a control terminal to which an enable signal is input; a second transistor connected between the intermediate node and a lower supply voltage, the second transistor adapted to discharge to the lower supply voltage a first current quantity according to data that is input to the input terminal; and a third transistor connected between the intermediate node and the lower supply voltage, the second transistor including a control terminal and being adapted to discharge to the lower supply voltage a second current quantity according to a control signal that is input to the control terminal thereof.

BRIEF DESCRIPTION OF THE DRAWINGS

The above objects and advantages of the present invention will become more apparent by describing in detail preferred embodiments thereof with reference to the attached drawings in which.

DETAILED DESCRIPTION

Figure 1:
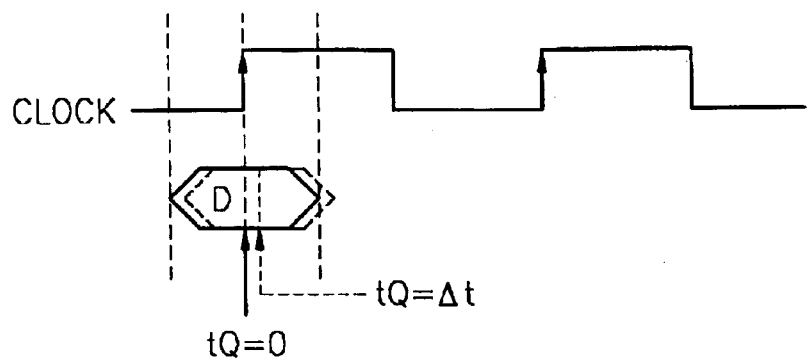
FIG. 1 is a timing diagram showing variations in data output time tQ.
Figure 2:
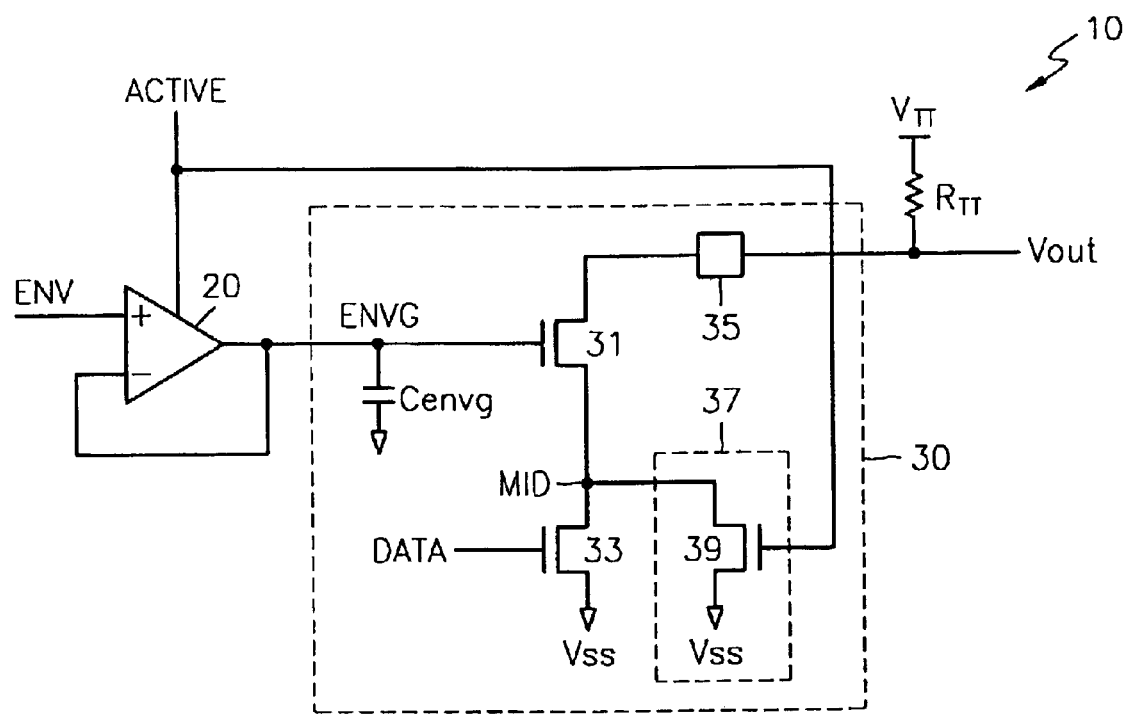
FIG. 2 is a block diagram of a semiconductor device having an open-drain output driver according to a first embodiment.

FIG. 2 is a block diagram of a semiconductor device having an open-drain output driver according to a first embodiment. Referring to FIG. 2, the semiconductor device 10 comprises an enable signal generating circuit 20 and an open-drain output driver 30. A terminating resistor (Rtt) is connected between a terminating voltage (Vtt) and an output terminal 35. The open-drain output driver 30 is an example of a data output driver.

The semiconductor device 10 includes a capacitor (Cenvg) between the gate of a first NMOS transistor 31 and a lower supply voltage (VSS) (e.g., ground). The capacitor (Cenvg) removes coupling voltage or coupling noise that is provided to the gate of a first NMOS transistor 31. Coupling voltage or coupling noise adversely affects the characteristics of an output signal. Therefore, it is beneficial that the capacitance of the capacitor (Cenvg) be substantially large.

Whether the open-drain output driver 30 operates or not, the output resistance of the open-drain output driver 30 is high. Therefore, with its advantage in channel impedance matching and other advantages, the open-drain output driver 30 is essentially used in the RAMBUS® DRAMs, and also is widely used in chip-to-chip connection systems.

The enable signal generating circuit 20 is implemented by a comparator, whose (+) input terminal receives a predetermined voltage, and whose (−) input terminal is connected to the output terminal of the comparator 20. In response to a control signal (ACTIVE), the enable signal generating circuit 20 compares the predetermined voltage (ENV) which is input to the (+) input terminal, with the voltage which is input to the (−) input terminal, and outputs an enable signal (ENVG), the result of the comparison, to the gate of the first NMOS transistor 31. The enable signal (ENVG) swings between the lower supply voltage (VSS) (e.g., ground) level and a first voltage level.

For example, if the semiconductor device 10 is in a stand-by state, the enable signal generating circuit 20 outputs an enable signal (ENVG) having the lower supply voltage (VSS) (e.g., ground) level to the gate of the first NMOS transistor 31. If the semiconductor device 10 performs a data read operation, the enable signal generating circuit 20 outputs an enable signal (ENVG) having the first voltage level to the gate of the NMOS transistor 31.

It is preferable that the first NMOS transistor 31 operates in a saturation region in response to the first voltage level. If the first NMOS transistor 31 operates in a saturation region, the output resistance value of the open-drain output driver 30 is kept substantially high.

The open-drain output driver 30 comprises a first driver (implemented by the first NMOS transistor 31), a second driver implemented by a second NMOS transistor 33, the output terminal 35, and a voltage control circuit 37. The second NMOS transistor is connected between an intermediate node (MID) and ground (VSS), and drives data (DATA), which is input to the gate of the second NMOS transistor 33, to the output terminal 35 through the intermediate node (MID).

Beneficially, the data (DATA) that is input to the gate of the second NMOS transistor 33 has a voltage level that is either near or at lower power supply voltage (VSS) (e.g., ground) (logic "0"), or near or at an upper power supply voltage (logic "1"). For the upper power supply voltage level, all power supply levels, including for example 3.3V, 2.5V, or 1.8V, can be used.

The first NMOS transistor 31 is connected between the output terminal 35 and the intermediate node (MID). The enable signal (ENVG) is input to the gate of the first NMOS transistor 31. Preferably, the enable signal (ENVG) is constant regardless of changes of coupling voltage (noise), voltage, temperature and process variations.

The voltage control circuit 37 is implemented by the third NMOS transistor 39, and is connected between the intermediate node (MID) and ground (VSS). A control signal (ACTIVE) is input to the gate of the third NMOS transistor 39. That is, in response to the control signal (ACTIVE) being activated (for example, in a logic "high" state) the voltage control circuit 37 maintains the intermediate node (MID) at a constant voltage.

Figure 3:
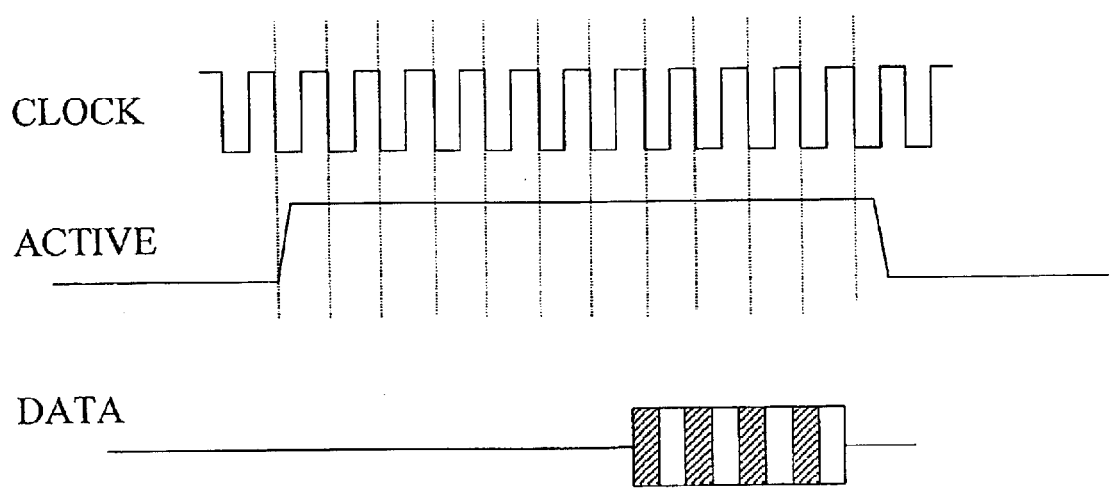
FIG. 3 is a timing diagram of a data read operation of the semiconductor device shown in FIG. 2.

FIG. 3 is a timing diagram of a data read operation of the semiconductor device 10 shown in FIG. 2. Referring to FIGS. 2 and 3, the operation of the semiconductor device 10 having the open-drain output driver 30 will now be explained in detail.

First, if the semiconductor device 10 is in a stand-by state, in response to a control signal (ACTIVE) which is inactivated (for example, at a logic "low" level), the enable signal generating circuit 20 outputs an enable signal (ENVG) having the lower supply voltage (VSS) (e.g., ground) level to the gate of the first NMOS transistor 31.

Since the second NMOS transistor 33 is turned off in a stand-by state, the open-drain output driver 30 is off. However, in a stand-by state, the first NMOS transistor 31 of the semiconductor device 10 may be off or on.

However, if the semiconductor device 10 performs a data read operation, in response to a control signal (ACTIVE) which is activated (for example, at a logic "high" level), the enable signal generating circuit 20 outputs the enable signal (ENVG) having the first voltage level to the gate of the first NMOS transistor 31.

Accordingly, the first NMOS transistor 31 operates in a saturation region and a first current path is formed between the output terminal 35 and the intermediate node (MID). The voltage of the output terminal 35 is determined according to the data (DATA) applied to the gate of the second NMOS transistor 33, and in this manner, the open-drain output driver 30 can perform a data read operation.

If the input data (DATA) has a logic value of "1," then the second NMOS transistor 33 is turned on. Accordingly, a current is discharged from the terminating power source ($V_{529}$) to ground (VSS), and the voltage at the output terminal 35 is determined by the ratio of the terminating resistance ($R_{529}$) to the turn-on resistance of transistors 31, 33, and 39.

If the input data (DATA) has a logic value of "0," then the second NMOS transistor 33 is turned off. Accordingly, the first current path from the terminating power source ($V_{529}$) to the intermediate node (MID) is formed and the intermediate node (MID) is charged. Here, the voltage that is output from the output terminal 35 has the level of the terminating power source ($V_{529}$).

If input data (DATA) that is a continuous string of logic "0s" is input to the gate of the second NMOS transistor 33 in a data read operation, the intermediate node (MID) continues to be charged by the first NMOS transistor 31, and therefore the voltage of the intermediate node (MID) slowly rises.

Also, since in response to an activated control signal (ACTIVE) the third NMOS transistor 39 is turned on, a second current path is formed between the intermediate node (MID) and ground (VSS).

The second current path causes some current which is flowing into the intermediate node (MID) through the first NMOS transistor 31 and charges the intermediate node (MID) (hereinafter, referred to as a "charging current") to flow to ground (VSS). Accordingly, the voltage (VMID) of the intermediate node (MID) is kept substantially constant by the presence of the second current path.

Figure 4:
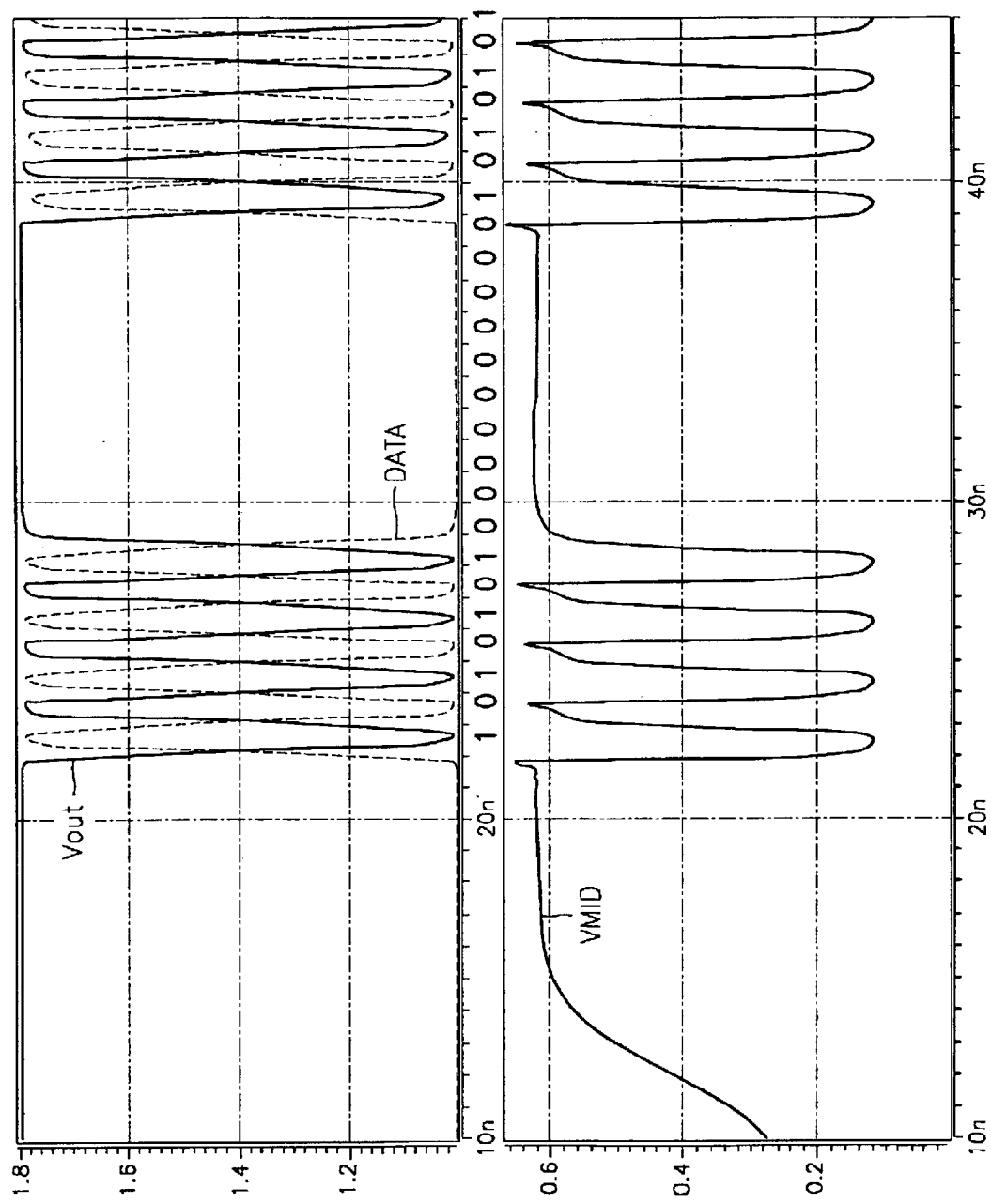
FIG. 4 is a timing diagram of an input and/or output waveform of the open-drain output driver shown in FIG. 2.

FIG. 4 is a timing diagram of an input and/or output waveform of the open-drain output driver shown in FIG. 2. Referring to FIG. 4, the output voltage ($V_{OUT}$) and data (DATA) swing between 1.0V and 1.8V, and the voltage (VMID) of the intermediate node (MID) swings between 0.1V and 0.62V. Here, the swing widths of the output voltage ($V_{OUT}$), data, and the voltage (VMID) of the intermediate node (MID) may vary in a variety of ways according to the design of a semiconductor device.

In a data read operation, if initial data is read, or if input data (DATA) having a logic value of "0" is continuously input to the gates of a plurality of the second NMOS transistors 33, the charging current flowing into the intermediate node (MID) through the first NMOS transistor 31 tends to cause the voltage (VMID) of the intermediate node (MID) to slowly rise from a voltage obtained by subtracting a threshold voltage of the first NMOS transistor 31 from the first voltage level.

However, because the third NMOS transistor 39 of the open-drain output driver 10 causes some of the charging current flowing into the intermediate node (MID) to flow to the lower supply voltage (VSS) (e.g., ground) through the second current path, the voltage (VMID) of the intermediate node (MID) is kept constant.

Referring to FIGS. 2 and 4, when data (DATA) having a logic value of "0" is input to the gate of the second NMOS transistor 33, the voltage (VMID) of the intermediate node (MID) is 0.62V and the voltage (Vout) of the output terminal 35 is 1.8V. When data (DATA) having a logic value of "1" is input to the gate of the second NMOS transistor 33, the voltage (VMID) of the intermediate node (MID) is 0.1V and the voltage (Vout) of the output terminal 35 is 1.0V.

In a data read operation, a process for reading initial data having a logic value of "1" leads to the same result as reading data having a logic value of ("1") which follows data comprising a series of consecutive logic "0s." Accordingly, since the second NMOS transistor 33 maintains an off state for a number of clock cycles in response to data comprising a series of consecutive logic "0s," the voltage (VMID) of the intermediate node (MID) tends to slowly rise due to the charging current through the first NMOS transistor 31.

However, since the third NMOS transistor 39 discharges the charging current flowing into the intermediate node (MID), to ground (VSS), the voltage (VMID) of the intermediate node (MID) is kept constant.

In the data read operation, even when data (DATA) having a logic value of "0" is continuously input to the gate of the second NMOS transistor 33, the third NMOS transistor 39 discharges the charging current flowing into the intermediate node (MID), and therefore, the voltage (VMID) of the intermediate node (MID) is kept constant.

Accordingly, the open-drain output driver 30 according to the first embodiment can maintain the data output time (tQ) of data having a logic value of "1", regardless of input data patterns, for example, 01, 0001, or 00001.

Figure 5:
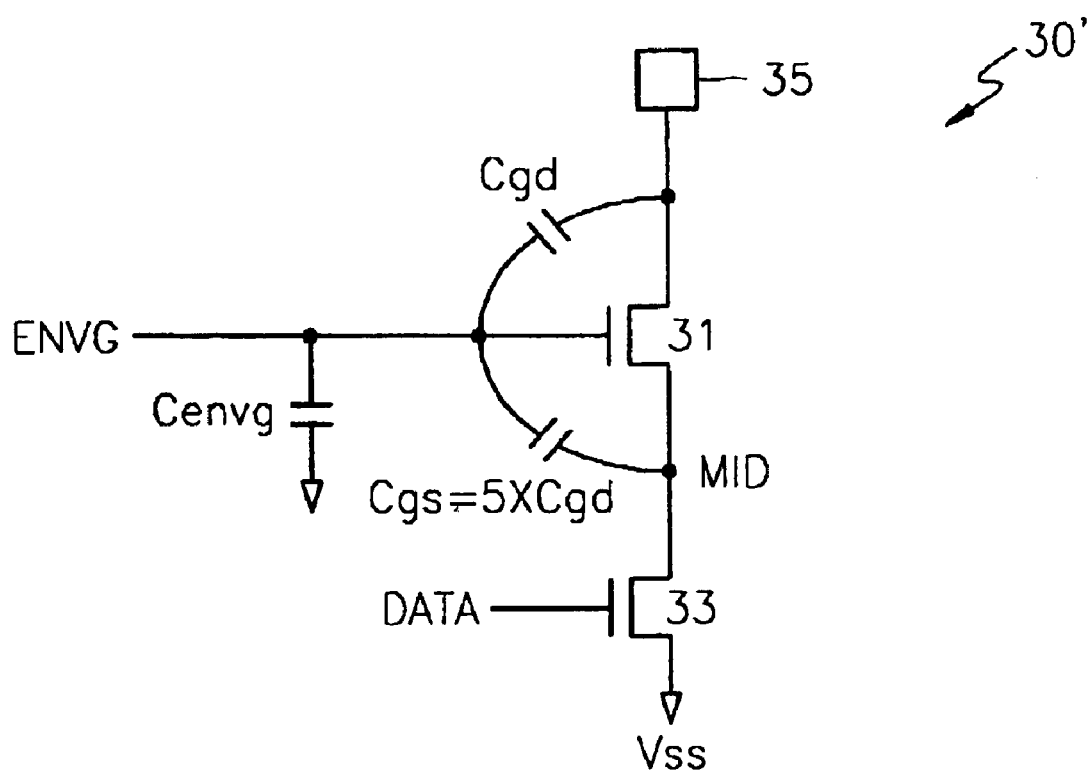
FIG. 5 is a diagram of an equivalent circuit of an open-drain output driver having no current path.

FIG. 5 is a diagram of an equivalent circuit of an open-drain output driver having no current path. That is, FIG. 5 shows a coupling environment of the open-drain output driver 10 shown in FIG. 2.

A parasitic capacitor (Cgd) is formed between the gate and drain of the first NMOS transistor 31, and a parasitic capacitor (Cgs) is formed between the gate and source of the first NMOS transistor 31.

Generally, the capacitance of the parasitic capacitor (Cgs) is about five times larger than that of the parasitic capacitor (Cgd). However, the ratio of the capacitance of the parasitic capacitor (Cgs) and the capacitance of the parasitic capacitor (Cgd) may be implemented with a variety of valves.

Referring to FIG. 5, the structures and functions of the first driver 31 and the second driver 33 of the open-drain output driver 30' are the same as the structures and functions of the first driver 31 and the second driver 33 of the open-drain output driver 30 of FIG. 2. However, the open-drain output driver 30' does not include the NMOS transistor 39 of FIG. 2.

Referring to FIGS. 4 and 5, according to the level of the data (DATA) that is input to the gate of the second NMOS transistor 33 (i.e., according to whether a logic "1" or a logic "0" is input), the swing width of the output voltage (Vout) of the output terminal 35 is about 800 mV, and the swing width of the voltage (VMID) of the intermediate node (MID) is about 500 mV.

That is, if data (DATA) that is input to the second NMOS transistor 33 is a logic "1", the output voltage (Vout) of the output terminal falls from 1.8V by 800 mV to become 1.0V, and the voltage (VMID) of the intermediate node (MID) falls from 0.6V by 500 mV to become 0.1V.

The variations in the output voltage (Vout) of the output terminal 35 and the voltage (VMID) of the intermediate node (MID) are coupled to the gate of the first NMOS transistor 31 by respective parasitic capacitors (Cgd, and Cgs) of the first NMOS transistor 31.

Accordingly, the coupling voltage (C_ENVG) coupled to the gate of the first NMOS transistor 31 by respective parasitic capacitors (Cgd, and Cgs) is basically determined by the following equation 1:

$$C\_ENVG = (dVout*Cgd + dVMID*Cgs)/(Cenvg + Cgd + Cgs) \quad (1)$$

Here, dVout denotes variation of the output voltage of the output terminal 35, and dVMID denotes variation of the voltage of the intermediate node (MID). Referring to FIG. 4, dVout is 800 mV and dVMID is 500 mV.

The coupling voltage (C_ENVG) is a noise voltage induced to the gate of the first NMOS transistor 31 by the voltage of the output terminal 35 or the voltage (VMID) of the intermediate node (MID) through respective parasitic capacitors (Cgd, and Cgs).

Meanwhile, the coupling voltage (C_ENVG) is proportional to the product of the voltage variations (dVout, dVMID) and the capacitance of the respective parasitic capacitors (Cgd, and Cgs). Since the capacitance of the capacitor (Cgs) is substantially larger than that of the capacitor (Cgd) in general, most of the coupling voltage (C_ENVG) is induced to the gate of the first NMOS transistor 31 by the voltage variation of the intermediate node (MID).

The smaller the coupling voltage (C_ENVG) is, the better the memory device is. Referring to equation 1, if the capacitance of the capacitor (Cenvg) is substantially larger than that of the capacitor (Cgd) or that of the capacitor (Cgs), the coupling voltage (C_ENVG) can be controlled.

However, since the layout area of the open-drain output driver 30' is substantially large, the capacitance of the capacitor (Cgs) and the capacitance of the capacitor (Cgd) are substantially large, too.

Accordingly, it is difficult to make a capacitor (Cenvg) having a large capacitance in comparison to the capacitance of the capacitor (Cgs) and the capacitance of the capacitor (Cgd). Also, it is difficult for the capacitor (Cenvg) having a large capacitance to charge an enable signal (ENVG) to the first voltage level or to discharge an enable signal (ENVG) to the lower supply voltage (VSS) (e.g., ground) level.

As noted above, the smaller the coupling voltage (C_ENVG) is, the better the memory device is. However, it is preferable that the coupling voltage (C_ENVG) is maintained at a constant level if it is actually impossible to remove the coupling voltage (C_ENVG) completely.

That is, when there is no variation of the coupling voltage (C_ENVG) by various data patterns or other signals (e.g., noise) that are input to the gate of the second NMOS transistor 33, the entire variation width of the data output time (tQ) decreases.

Regarding two factors affecting the coupling voltage (C_ENVG), the coupling by the capacitor (Cgd) is held constant by the output voltage (Vout) always swinging 800 mV, but the coupling by the capacitor (Cgs) can vary according to the voltage (VMID) of the intermediate node (MID).

Referring to the equation 1, since the voltage variation (dVMID) of the intermediate node (MID) affects the coupling voltage (C_ENVG), the driving capability of the first NMOS transistor 31, which operates in a saturation region in response to an enable signal (ENVG), is affected by the voltage variation (dVMID), and as a result, the data output time (tQ) changes according to the pattern of the data (DATA) which is input to the gate of the second NMOS transistor 33.

Accordingly, the third NMOS transistor 39 of the open-drain output driver 30 shown in FIG. 2 minimizes the variation of the voltage (VMID) of the intermediate node (MID) caused by the pattern of data (DATA) that is input to the gate of the second NMOS transistor 33 such that the variation of the data output time (tQ) is minimized.

That is, since the third NMOS transistor 39 forms a second current path between the intermediate node (MID) and ground (VSS), and can keep the voltage (VMID) of the intermediate node (MID) constant, the open-drain output driver 10 of FIG. 2 minimizes the variation of the data output time (tQ) regardless of the pattern of data (DATA) that is input to the gate of the second NMOS transistor 33.

Figure 6:
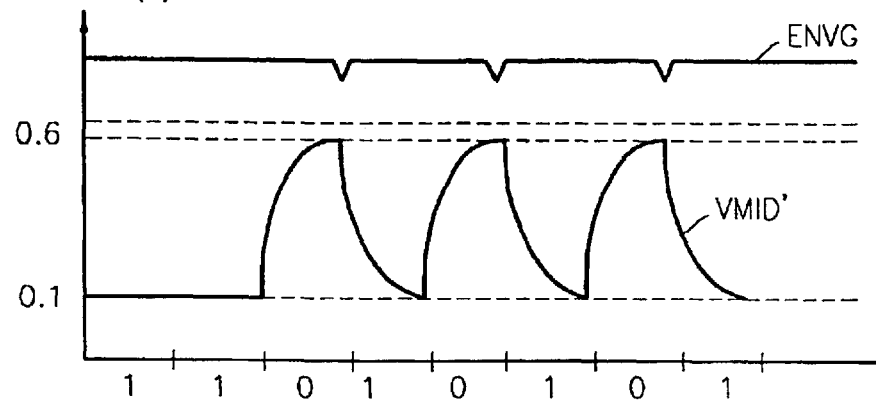
FIG. 6 is a timing diagram showing an enable signal of an open-drain output driver and a voltage waveform of an intermediate node according to a first data pattern.

FIG. 6 is a timing diagram showing an enable signal of an open-drain output driver and a voltage waveform of an intermediate node according to a first data pattern.

Referring to FIGS. 5 and 6, in a data read operation, if a data pattern comprising an alternating series of logic "0s" and logic "1s" is input to the gate of the second NMOS transistor 33, the voltage (VMID') of the intermediate node MID swings between 0.1V and 0.6V. Here, the variation caused by the coupling voltage (C_ENVG) is small.

Figure 7:
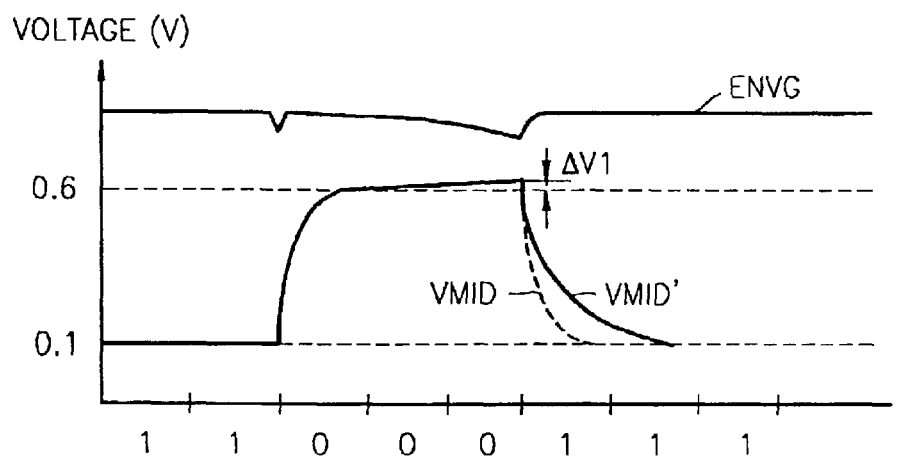
FIG. 7 is a timing diagram showing an enable signal of an open-drain output driver and a voltage waveform of an intermediate node according to a second data pattern.

FIG. 7 is a timing diagram showing an enable signal of an open-drain output driver and a voltage waveform of an intermediate node according to a second data pattern.

Referring to FIGS. 5 and 7, if a data pattern of "11000111" is input to the gate of the second NMOS transistor 33 in a data read operation, the second NMOS transistor 33 is turned off during an interval where the "000" data (DATA) are input. Accordingly the charging current flows into the intermediate node (MID) through the first NMOS transistor 31. Therefore, the voltage (VMID') of the intermediate node (MID) slowly rises to a level ΔV1 as shown in FIG. 7.

Therefore, since the coupling voltage (C_ENVG) based on the equation 1 increases when the voltage (VMID') of the intermediate node (MID) increases by ΔV1, an enable signal (ENVG) affected by the coupling decreases when data having a logic value "1" is read.

Accordingly, the current driving capability of the first NMOS transistor 31 decreases, and a time increases for discharging the voltage (VMID') of the intermediate node (MID) to the level when data is read having a logic value of "1" (for example, 0.1V).

As a result, if data having a logic value of "1" is input to the gate of the second NMOS transistor 33 after a sequence of data having a logic value of "000", then the output time (tQ) of the "1" data that is input after "000" data is delayed.

Now, referring to FIGS. 2 and 7, if a data pattern of "11000111" is input to the gate of the second NMOS transistor 33 in a data read operation, the second NMOS transistor 33 is turned off during an interval where the "000" data (DATA) are input. Accordingly, the charging current flows into the intermediate node (MID) through the first NMOS transistor 31.

However, in contrast to the case above referring to FIGS. 5 and 7, because the third NMOS transistor 39 of the open-drain output driver 10 discharges some the charging current flowing into the intermediate node (MID) to the lower supply voltage (VSS) (e.g., ground) in the response to the control signal (ACTIVE), the voltage (VMID) of the intermediate node (MID) is maintained at or near a constant level.

Accordingly, if data having a logical value "1" is input to the gate of the second NMOS transistor 33 after a sequence of data having a logic value of "000," the output time (tQ) of the "1" data that is input after the "000" data is almost the same as the output time (tQ) of the "1" data that is input after the single "0" data of FIG. 6.

Figure 8:
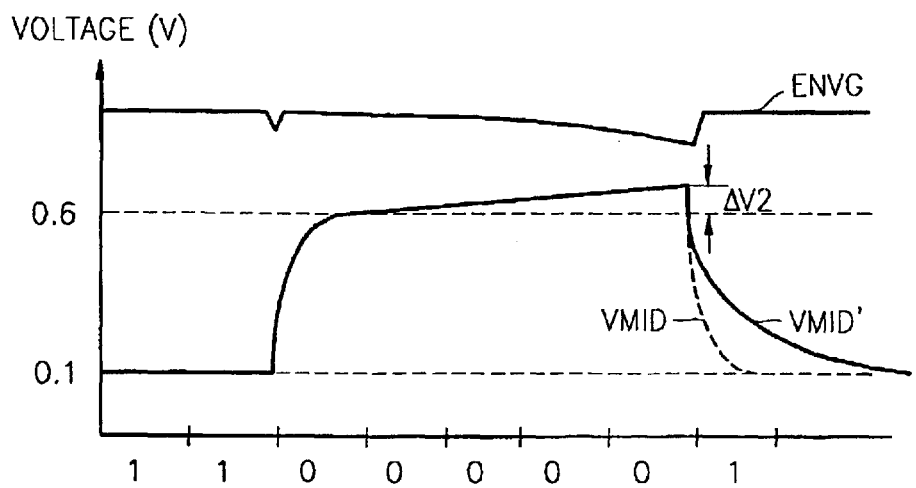
FIG. 8 is a timing diagram showing an enable signal of an open-drain output driver and a voltage waveform of an intermediate node according to a third data pattern.

FIG. 8 is a timing diagram showing an enable signal of an open-drain output driver and a voltage waveform of an intermediate node according to a third data pattern.

Referring to FIGS. 5 and 8, in a data read operation, if a data pattern of "11000001" is input to the gate of the second NMOS transistor 33, the second NMOS transistor 33 is turned off during an interval where the "00000" data (DATA) are input. Accordingly the charging current flows into the intermediate node (MID) through the first NMOS transistor 31. Therefore, the voltage (VMID') of the intermediate node (MID) slowly rises to a level ΔV2, greater than ΔV1, as shown in FIG. 8.

Accordingly, since the coupling voltage (C_ENVG) based on the equation 1 increases more when the voltage (VMID') of the intermediate node (MID) increases by ΔV2 than it does when VMID' increases by ΔV1, the enable signal (ENVG) decreases more than it does when VMID' increases by ΔV1 as in FIG. 7. As a result, the current driving capability of the first NMOS transistor 31 decreases further, and a time for discharging the intermediate node (MID) to the lower supply voltage (VSS) (e.g., ground) level increases further.

Therefore, if data having a logic value of "1" is input to the gate of the second NMOS transistor 33 after a sequence of data having a logic value of "00000," the data output time (tQ) is delayed for the "1" data that follows the "00000" data sequence.

Now, referring to FIGS. 2 and 8, in a data read operation, if a data pattern of "11000001" is input to the gate of the second NMOS transistor 33, the second NMOS transistor 33 is turned off during an interval where data "00000" are input. Accordingly, the charging current flows into the intermediate node (MID) through the first NMOS transistor 31.

However, in contrast to the case above referring to FIGS. 5 and 8, because the third NMOS transistor 39 discharges some the charging current flowing into the intermediate node (MID) to lower supply voltage (VSS) (e.g., ground) in response to the control signal (ACTIVE), the voltage (VMID) of the intermediate node (MID) is maintained at or near a constant level.

Accordingly, if data having a logical value "1" is input to the gate of the second NMOS transistor 33 after a sequence of data having a logic value of "00000", the output time (tQ) of the "1" data that is input after the "00000" data is almost the same as the output time (tQ) of the "1" data that is input after the "000" data of FIG. 7.

Referring to FIGS. 2, 4, 6, and 8, the open-drain output driver 30 as disclosed herein substantially reduces the variation of the output time (tQ) of data "1" in a data read operation even when data patterns that are input to the gate of the second NMOS transistor 33 are 01, 001, 0001, 0001, and 000001, etc., for example.

Figure 9:
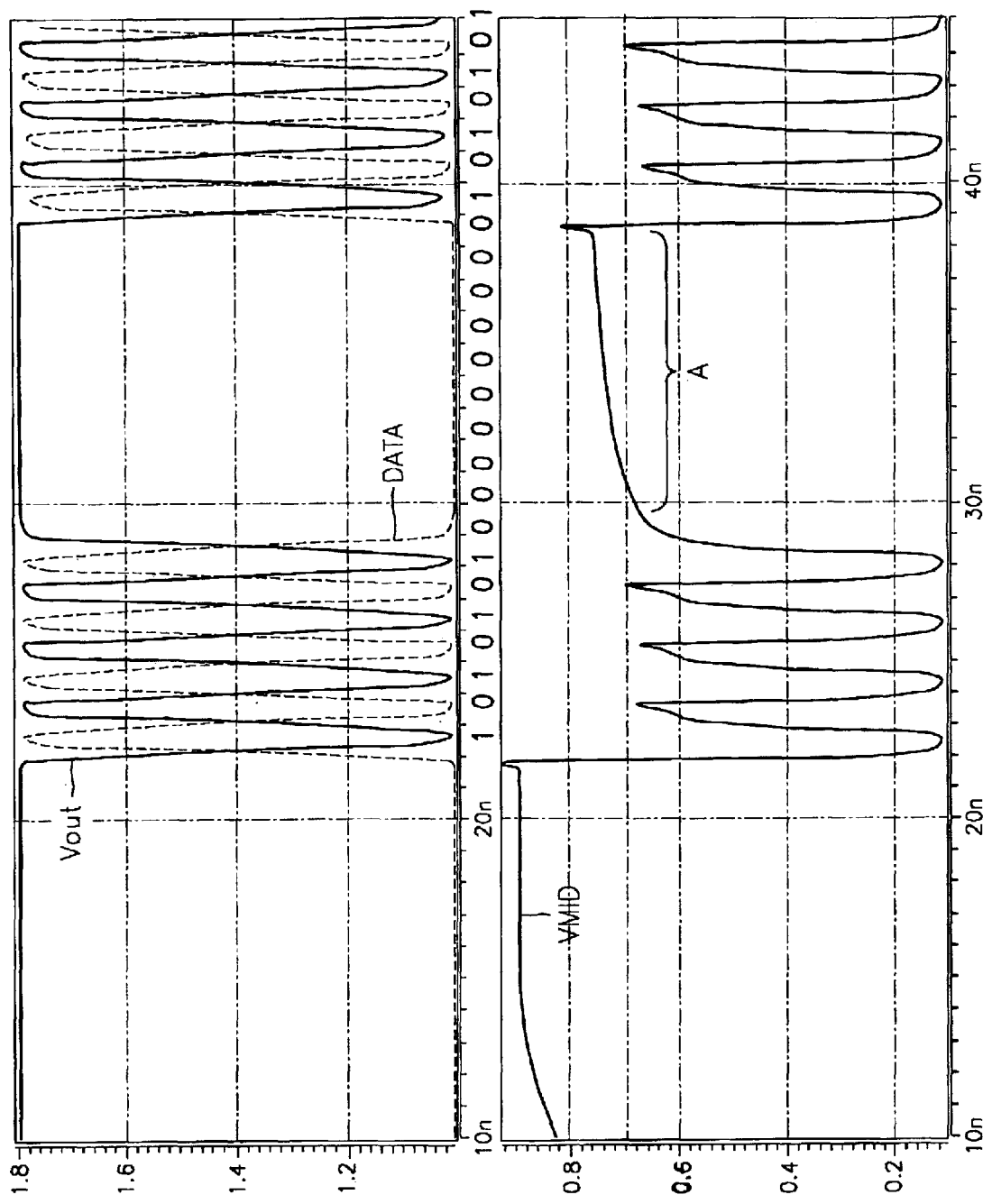
FIG. 9 is a timing diagram of an input and/or output waveform of the open-drain output driver shown in FIG. 5.

FIG. 9 is a timing diagram of an input and/or output waveform of the open-drain output driver shown in FIG. 5.

Referring to FIGS. 5 and 9, the voltage (VMID') of the intermediate node (MID) of the open-drain output driver 30' of FIG. 5 is different when data is initially read than it is in an interval "A" where a continuous string of logic "0s" is input. Before data is initially read, the voltage (VMID') of the intermediate node (MID) rises up to about 0.9V. In contrast, in the interval "A," the voltage (VMID') of the intermediate node (MID) only rises up to about 0.76V. In other intervals, the voltage (VMID') of the intermediate node (MID) rises up to about 0.68V.

Therefore, the coupling voltage (C_ENVG) of the equation 1 coupled to the gate of the first NMOS transistor 31 varies according to the pattern of data input to the gate of the second NMOS transistor 33 and, as a result, the data output time (tQ) varies according to the data patterns.

Referring to FIGS. 2 and 4, however, the open-drain output driver 30 as disclosed herein maintains a constant voltage variation (dVMID) of the intermediate node regardless of the data patterns input to the gate of the second NMOS transistor 33. Accordingly, the variation of the data output time (tQ) is substantially minimized.

Figure 10:
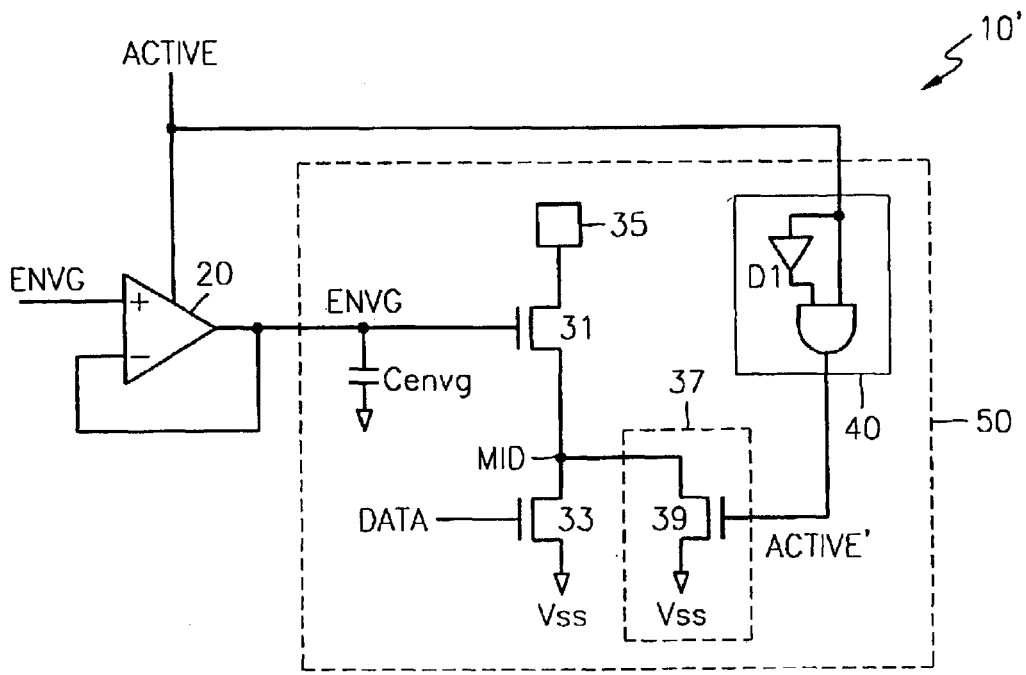
FIG. 10 is a block diagram of a semiconductor device having an open-drain output driver according to a second embodiment.

FIG. 10 is a block diagram of a semiconductor device having an open-drain output driver according to a second embodiment. Referring to FIG. 10, the semiconductor device 10' comprises an enable signal generating circuit 20 and an open-drain output driver 50.

The open-drain output driver 50 comprises a first driver 31, a second driver 33, an output terminal 35, a voltage control circuit 37, and an enable interval control circuit 40. The second driver 33 is implemented by a second NMOS transistor connected between an intermediate node (MID) and ground (VSS), and drives data (DATA) that is input to the gate of the second NMOS transistor 33 to the output terminal 35 through the intermediate node (MID).

The first driver 31 is implemented by a first NMOS transistor, and is connected between the output terminal 35 and the intermediate terminal (MID). An enable signal (ENVG) is input to the gate of the first NMOS transistor 31.

Figure 11:
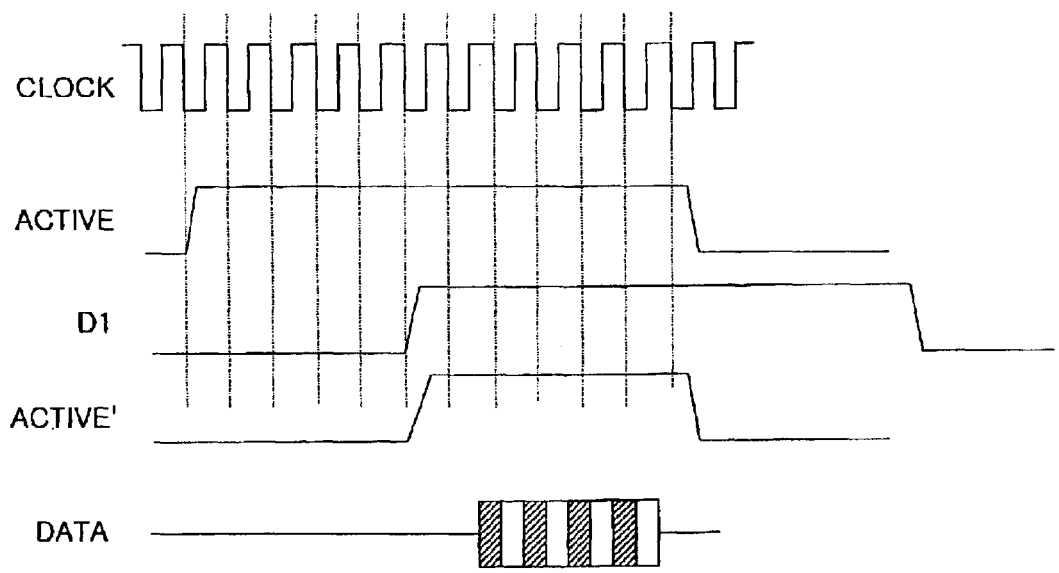
FIG. 11 is a timing diagram of a data read operation of the semiconductor device shown in FIG. 10.

FIG. 11 is a timing diagram of a data read operation of the semiconductor device shown in FIG. 10. Referring to FIGS. 10 and 11, the voltage control circuit 37 is implemented by the third NMOS transistor 39, and is connected between the intermediate node (MID) and ground (VSS). The first control signal (ACTIVE') is input to the gate of the third NMOS transistor 39.

The enable interval control circuit 40 comprises a buffer and an AND gate, and controls activated intervals of the first control signal (ACTIVE') by performing an AND operation of the control signal (ACTIVE) and the output signal (D1) of the buffer.

For example, it is beneficial that an activated interval of the first control signal (ACTIVE') is activated at least one cycle before data (DATA) is input, and is inactivated at least one cycle after data (DATA) are all read. By controlling the activation interval of the first control signal (ACTIVE'), the power that is consumed by the third NMOS transistor 39 can be reduced.

Because the structures and operations of the circuits 20, 31, 33, 35, and 39 shown in FIG. 10 are practically the same as the structures and operations of the circuits 20, 31, 33, 35, and 39 shown in FIG. 2, respectively, detailed descriptions will be omitted.

When the semiconductor device 10' performs a data read operation, the third NMOS transistor 39 is turned on in response to the first control signal (ACTIVE') such that when the voltage of the data (DATA) is input to the gate of the NMOS transistor 33, the rise of the voltage (VMID) caused by variations in data patterns, processes, voltage, and temperature, etc. is prevented.

Accordingly, when the semiconductor device 10' performs a data read operation, the third NMOS transistor 39 discharges some of the charging current flowing into the intermediate node (MID) so that the voltage (VMID) of the intermediate node (MID) is maintained at or near a constant level.

As a result, since the coupling voltage (C_ENVG) based on the equation 1 is constant regardless of the patterns of the data (DATA) input to the gate of the second NMOS transistor 33, any variation of the data output time (tQ) caused by different data patterns input to the gate of the second NMOS transistor 33 is minimized.

Figure 12:
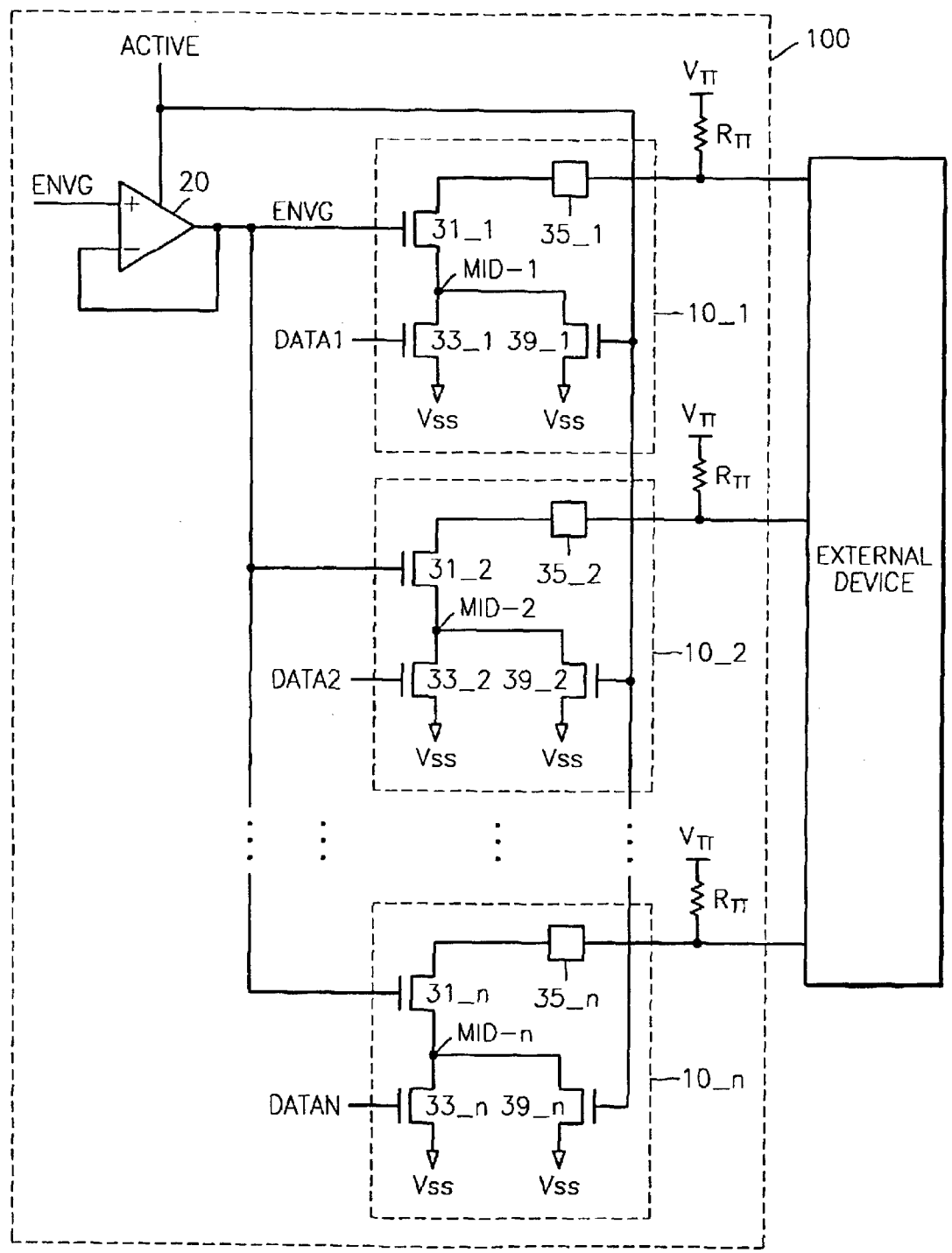
FIG. 12 is a block diagram of a semiconductor device having an open-drain output driver according to a third embodiment.

FIG. 12 is a block diagram of a semiconductor device having an open-drain output driver according to a third embodiment. Referring to FIG. 12, the semiconductor device 100 comprises an enable signal generating circuit 20 and a plurality of data output drivers 10_1 through 10_n. It is preferable that each of the plurality of data output drivers 10_1 through 10_n is an open-driver output driver.

The structures and functions of the enable signal generating circuit 20 of FIG. 12 are the same as the structures and functions of the enable signal generating circuits 20 of FIG. 2. That is, when the semiconductor device 100 is in a stand-by state, the enable signal generating circuit 20 outputs an enable signal (ENVG) having the lower supply voltage (VSS) (e.g., ground) level to the gate of each transistor 31_1 through 31_n.

When the semiconductor device 100 performs a data read operation, the enable signal generating circuit 20 outputs an enable signal (ENVG) having the first voltage level to the gate of each transistor 31_1 through 31_n. Accordingly, in response to the enable signal (ENVG), each transistor 31_1 through 31_n operates in a saturation region.

The structures and functions of the open-drain output drivers 10_1 through 10_n are the same as the structure and function of any of the open-drain output drivers 10 and 10' shown in FIGS. 2 and 10.

Open-drain output drivers 10_1 through 10_n each drive data (DATA1 through DATAN), which are input through input terminals, to respective output terminals. Terminating resistors (RTTS) are connected between the terminating voltage (VTT) and respective output terminals 35_1 through 35_n.

Transistors 39_1 through 39_n are each connected between respective intermediate nodes (MID_1 through MID_n) and the ground (VSS). Transistors 39_1 through 39_n each discharge some of the charging current flowing into the respective intermediate nodes (MID_1 through MID_n) through respective transistors 31_1 through 31_n, to the lower supply voltage (VSS) (e.g., ground) so that respective intermediate nodes (MID_1 through MID_n) are maintained at a constant voltage level. Accordingly, the coupling voltage (C_ENVG) which is expressed by the equation 1 and is coupled to the gate of each transistor 31_1 through 31_n also decreases.

When the semiconductor device 100 performs a data read operation, the current consumed by each transistor 39_1 through 39_n is quite small, for example, 1/180 of the current consumed in a data read operation. Accordingly, the voltage drop of each output terminal 35_1 through 35_n caused by each transistor 39_1 through 39_n is on the order of millivolts (mV).

Therefore, the plurality of open-drain output drivers 10_1 through 10_n minimize variation of respective data output times (tQ) caused by data patterns input to respective input terminals 33_1 through 33_n.

As described above, the open-drain output driver and data output method as discussed herein can minimize the variation of the data output time (tQ) caused by data patterns input to the input terminal. As a result, the open-drain output driver and data output method can transmit data at a high speed.

Embodiments have been explained above and are shown. However, the present invention is not restricted to the above-described embodiments and many variations are possible within the spirit and scope of the present invention. The scope of the present invention is not determined by the above description but by the accompanying claims.

What is claimed is:

1. A data output driver adapted to drive data that is input through an input terminal, to an output terminal, comprising:

an intermediate node;
a first driver connected between the output terminal and the intermediate node, the first driver having a control terminal and being adapted to provide a current path between the intermediate node and the output terminal in response to an enable signal input to the control terminal;
a second driver connected between the intermediate node and a lower supply voltage and being adapted to drive the data that is input to the input terminal to the output terminal through the intermediate node in a data read operation; and
a voltage control circuit connected between the intermediate node and the lower supply voltage, wherein the voltage control circuit has a control terminal and is adapted to cause at least a portion of the current of the intermediate node to flow to the lower supply voltage in response to a control signal input to the control terminal.

2. The data output driver of claim 1, wherein the voltage control circuit is adapted to maintain a voltage swing at the intermediate node at a substantially constant level during the data read operation.

3. The data output driver of claim 1, wherein the current driving capability of the voltage control circuit is less than the current driving capability of the first driver.

4. A data output driver having an input terminal and an output terminal, comprising:
a first current path provided between the output terminal and an intermediate node when a data read operation is performed;
a driver adapted to drive data that is input through the input terminal, to the output terminal through the intermediate node in the data read operation; and
a second current path provided between the intermediate node and a lower supply voltage during the data read operation.

5. The data output driver of claim 4, wherein the second current path causes a portion of a charging current, that flows into the intermediate node through the first current path, to flow into the lower supply voltage.

6. A data output driver adapted to drive data that is input through an input terminal, to an output terminal, comprising:
an intermediate node;
a first transistor connected between the output terminal and the intermediate node, the first transistor including a control terminal to which an enable signal is input;
a second transistor connected between the intermediate node and a lower supply voltage, the second transistor including the input terminal through which the data is input; and
a third transistor connected between the intermediate node and the lower supply voltage, the third transistor including a control terminal to which a control signal is input.

7. The data output driver of claim 6, wherein the enable signal is activated when the data output driver performs a data read operation.

8. The data output driver of claim 6, wherein the control signal is activated when the data output driver performs a data read operation.

9. The data output driver of claim 6, wherein when the data output driver performs a data read operation, the third transistor discharges to the lower supply voltage a portion of a current flowing into the intermediate node, to maintain a voltage swing at the intermediate node at a substantially constant level during the data read operation.

10. The data output driver of claim 6, wherein the first through the third transistors are NMOS transistors.

11. A data output driver comprising:
an output terminal;
an intermediate node;
a first transistor connected between the output terminal and the intermediate node, and including a gate to which an enable signal is input;
a second transistor connected between the intermediate node and a lower supply voltage, and including a gate to which data is input; and
a third transistor connected between the intermediate node and the lower supply voltage, and comprising a gate to which a control signal is input.

12. The data output driver of claim 11, wherein when the data output driver performs a data read operation, the third transistor causes a predetermined amount of a current flowing into the intermediate node through the first transistor to flow to the lower supply voltage, maintaining a voltage swing at the intermediate node at a substantially constant level during the data read operation.

13. In a data output driver having an input terminal, an output terminal, and an intermediate node, a method of outputting to the output terminal data that is input to the input terminal, the method comprising:
providing a current path between the intermediate node and a lower supply voltage to maintain a voltage swing voltage at the intermediate node at a substantially constant level during a data read operation; and
outputting through the intermediate node to the output terminal the data that is input to the input terminal.

14. The method of claim 13, wherein the current path is provided between the intermediate node and the lower supply voltage in response to a data read signal, said current path causing a portion of a charging current, flowing into the intermediate node, to flow to the lower supply voltage.

15. In a data output driver having an input terminal, an output terminal, and an intermediate node, a method of outputting to the output terminal data that is input to the input terminal, the method comprising:
maintaining a voltage swing at the intermediate node at a substantially constant level during a data read operation; and
outputting the data which is input through the input terminal, to the output terminal through the intermediate node.

16. A semiconductor memory device comprising a plurality of data output drivers for outputting data that are input through respective input terminals, to respective output terminals, wherein each of the plurality of data output drivers comprises:
an intermediate node;
a first transistor connected between one of the output terminals and the intermediate node, and including a gate to which an enable signal is input;
a second transistor connected between the intermediate node and a lower supply voltage, and including a gate to which one of the plural data is input; and
a third transistor connected between the intermediate node and the lower supply voltage, and comprising a gate to which a control signal is input.

17. The semiconductor memory device of claim 16, wherein when the semiconductor device performs a data read operation, the third transistor causes a predetermined amount of a current flowing into the intermediate node through the first transistor to flow to the lower supply voltage, maintaining a voltage swing at the intermediate node at a substantially constant level during the data read operation.

18. A data output driver having an input terminal and an output terminal, comprising:

an intermediate node;

a first transistor connected between the output terminal and the intermediate node, the first transistor including a control terminal to which an enable signal is input;

a second transistor connected between the intermediate node and a lower supply voltage, the second transistor adapted to discharge to the lower supply voltage a first current quantity according to data that is input to the input terminal; and a third transistor connected between the intermediate node and the lower supply voltage, the second transistor including a control terminal and being adapted to discharge to the lower supply voltage a second current quantity according to a control signal that is input to the control terminal thereof.

* * * * *